United States Patent
Ming et al.

(10) Patent No.: US 11,908,870 B2
(45) Date of Patent: Feb. 20, 2024

(54) THIN FILM TRANSISTOR ARRAY SUBSTRATE HAVING METAL LAYER BRIDGING STRUCTURE AND DISPLAY PANEL INCLUDING THE SAME

(71) Applicant: Wuhan China Star Optoelectronics Semiconductor Display Technology Co., Ltd., Wuhan (CN)

(72) Inventors: Xing Ming, Wuhan (CN); Zhongtao Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 838 days.

(21) Appl. No.: 16/957,392

(22) PCT Filed: Oct. 22, 2019

(86) PCT No.: PCT/CN2019/112486
§ 371 (c)(1),
(2) Date: Jun. 24, 2020

(87) PCT Pub. No.: WO2021/007980
PCT Pub. Date: Jan. 21, 2021

(65) Prior Publication Data
US 2023/0102637 A1 Mar. 30, 2023

(30) Foreign Application Priority Data
Jul. 18, 2019 (CN) .......................... 201910651774.3

(51) Int. Cl.
H01L 27/12 (2006.01)
H10K 77/10 (2023.01)
(Continued)

(52) U.S. Cl.
CPC ....... *H01L 27/1218* (2013.01); *H10K 59/123* (2023.02); *H10K 77/111* (2023.02); *H10K 59/1201* (2023.02); *H10K 2102/311* (2023.02)

(58) Field of Classification Search
CPC .............. H01L 27/1218; H10K 59/123; H10K 2102/311
(Continued)

(56) References Cited

U.S. PATENT DOCUMENTS

| 10,211,277 B2 | 2/2019 | Lee et al. |
| 2003/0042482 A1 | 3/2003 | Jun |

(Continued)

FOREIGN PATENT DOCUMENTS

| CN | 107799538 | 3/2018 |
| CN | 108074957 | 5/2018 |

(Continued)

*Primary Examiner* — Xia L Cross
(74) *Attorney, Agent, or Firm* — PV IP PC; Wei Te Chung; Zhigang Ma

(57) ABSTRACT

A TFT array substrate includes a substrate layer and a metal layer disposed on the substrate layer. The metal layer includes a metal layer bridging structure having a first metal layer and a bridging second metal layer. An insulating layer is disposed between the first metal layer and the bridging second metal layer. The first metal layer includes two segments of a first segment and a second segment of the first metal layer, which are disposed at intervals. The first segment and the second segment of the first metal layer are connected by the bridging second metal layer. The TFT array substrate has a bending region adopting a new metal layer routing structure, and routing of the first metal layer in the bending region is prevented from passing through two holes of a filling layer (OILD), thereby effectively reducing the risk of subsequent breakage due to over-etching.

12 Claims, 4 Drawing Sheets

(51) Int. Cl.
*H10K 59/123* (2023.01)
*H10K 102/00* (2023.01)
*H10K 59/12* (2023.01)

(58) Field of Classification Search
USPC .......................................................... 257/72
See application file for complete search history.

(56) References Cited

U.S. PATENT DOCUMENTS

| | | |
|---|---|---|
| 2016/0372534 A1 | 12/2016 | Lee |
| 2018/0047802 A1 | 2/2018 | Yoon et al. |
| 2019/0140029 A1 | 5/2019 | Kim et al. |
| 2019/0164995 A1* | 5/2019 | Lee ..................... H10K 77/111 |
| 2019/0355800 A1 | 11/2019 | Saitoh et al. |
| 2020/0176483 A1 | 6/2020 | Wang |

FOREIGN PATENT DOCUMENTS

| | | |
|---|---|---|
| CN | 108091679 | 5/2018 |
| CN | 109585511 | 4/2019 |
| CN | 109638018 | 4/2019 |
| WO | WO 2019/026237 | 2/2019 |

\* cited by examiner

THIN FILM TRANSISTOR ARRAY SUBSTRATE HAVING METAL LAYER BRIDGING STRUCTURE AND DISPLAY PANEL INCLUDING THE SAME

RELATED APPLICATIONS

This application is a National Phase of PCT Patent Application No. PCT/CN2019/112486 having International filing date of Oct. 22, 2019, which claims the benefit of priority of Chinese Patent Application No. 201910651774.3 filed on Jul. 18, 2019. The contents of the above applications are all incorporated by reference as if fully set forth herein in their entirety.

BACKGROUND OF INVENTION

Field and Background of the Invention

The present invention relates to the field of flat display technology, and more particularly, to a thin film transistor (TFT) array substrate and a display panel thereof.

It is known that with the continuous development of display technology, flat display devices have gradually become mainstream display devices on the market. Among them, organic light-emitting diode (OLED) display panels developed by the industry have advantages such as light weight, self-illumination, wide viewing angles, low driving voltage, high luminous efficiency, low power consumption, and fast response time, and OLED display panels are extensively applied, gradually being recognized by the industry as the next generation mainstream display panel replacing liquid crystal display panel.

In addition to the above advantages, OLED display devices have a particularly important characteristic, that is, bendability. This bendable property gives OLED display devices an absolute advantage in portability, and therefore OLED display devices have become the focus of research and development in the industry.

For example, flexible and foldable active matrix organic light emitting diodes (AMOLEDs) are manufactured by low-temperature polycrystalline silicon (LTPS) process including 10 to 15 steps, which have two to three more mask steps than rigid AMOLEDs. The most common process steps are to etch the inorganic film with poor stress and poor flexibility in the non-display bending region so as to form two deep holes (DH1, DH2). Then, an organic material, which is generally an organic polyimide (PI) material, having a better flexibility is filled in the deep holes, and a filling layer (OILD) is formed, and therefore it facilitates the bending property thereof.

Referring to FIG. 6, it is a schematic view of a TFT array substrate adopting a conventional flexible AMOLED. As shown in FIG. 1, the TFT array substrate includes a display region 100' and a bending region 110'. The display region 100' is generally provided with a TFT device functional layer. In the bending region 110', a metal layer used as a data line is provided, and the metal layer is generally used as a first metal layer (SD1) serving as source and drain in the display region.

According to the LTPS process in the industry, referring to FIG. 7 and FIG. 8, in the peripheral bending region 110' of the display panel, a filling layer 102' is filled with the PI material, and a portion edge of the hole of the first deep hole (DH1) may be covered with the PI material so as to form symmetrical side ends. In order to prevent the first metal layer (SD1) 104' from remaining at the edge position of the OILD layer 102' resulting in a short circuit, a method currently used in the industry is to make a transferring position of the first metal layer 104' used as a data line of the bending region 110' disposed on the covering region of the OILD layer 102', and only one hole is defined in a transferring position of the OILD layer.

However, there is a problem in the above-mentioned structure. At a position of a frame line region 130' shown in FIG. 7, the OILD layer 102' has holes on both sides, so the middle portion is raised. Therefore, bending stress is difficult to release, and when the first metal layer (SD1) 104' is etched, the first metal layer 104' serving as a metal line is easily broken due to the raised position, and this can be specifically seen from the circled portion 150' in FIG. 8.

Therefore, it is necessary to develop a novel TFT array substrate to overcome the drawbacks in the prior art.

SUMMARY OF THE INVENTION

A TFT array substrate has a bending region adopting a new metal layer routing structure, and the routing of the first metal layer in the bending region is prevented from passing through the two holes of the filling layer (OILD), thereby effectively reducing the risk of subsequent breakage due to over-etching.

A thin film transistor (TFT) array substrate includes a substrate layer and a metal layer disposed on the substrate layer. The metal layer includes a metal layer bridge structure, the metal layer bridge structure includes a first metal layer and a bridged second metal layer, and an insulating layer is disposed between the first metal layer and the bridged second metal layer. The first metal layer includes two segments of a first segment of the first metal layer and a second segment of the first metal layer, the first segment of the first metal layer and the second segment of the first metal layer are disposed at intervals, and the bridged second metal layer connects the first segment of the first metal layer and the second segment of the first metal layer.

In one embodiment, the array substrate includes a display region and a bending region, and the metal layer bridge structure is disposed in the bending region.

In one embodiment, the metal layer in the bending region further includes a second gate layer of the bending region, and the first metal layer of first segment bending region is electrically connected to the second gate layer of the bending region through a via hole.

In one embodiment, the metal layer in the bending region further comprises a second metal layer of the bending region and a first gate layer of the bending region, and the second metal layer of the bending region is electrically connected to the first gate layer of the bending region through a via hole.

In one embodiment, the metal layer in the bending further includes a first transferring metal layer, and the first transferring metal layer is electrically connected to the second metal layer of the bending region and the first gate layer of the bending region through the via hole.

In one embodiment, the substrate layer in a display region is provided with a TFT device functional layer, and the metal layer includes a first gate layer, a second gate layer, and a first metal layer of the TFT device functional layer.

In one embodiment, the metal layer in the display region further includes a second metal layer, and the second metal layer is electrically connected to the first metal layer through a via hole.

In one embodiment, the metal layer further includes an anode metal layer, and the anode metal layer is electrically connected to the second metal layer through a via.

A display panel includes the above-mentioned TFT array substrate.

In one embodiment, the display panel is a flexible active matrix organic light emitting diode (AMOLED) display panel.

The present invention relates to a TFT array substrate, which adopts a novel segmented bridge routing structure of a first metal layer in a bending region thereof. A complete first metal layer is divided into two segments, and then a complete routing structure between the two segments disposed at intervals is achieved by adding a transferring second metal layer; thereby a trace of the original first metal layer in the bending region is replaced by the bridging second metal layer disposed above a position between two holes of an OILD filling layer, and the original position is filled in by a planarization layer, thereby preventing the problem of easy breakage at this position.

BRIEF DESCRIPTION OF THE SEVERAL VIEWS OF THE DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained by those skilled in the art based on drawings without any creative effort.

DESCRIPTION OF SPECIFIC EMBODIMENTS OF THE INVENTION

The technical solutions of a thin film transistor (TFT) array substrate and a display panel thereof according to the present invention are further described in detail below with reference to the accompanying drawings and embodiments.

Figure 1:
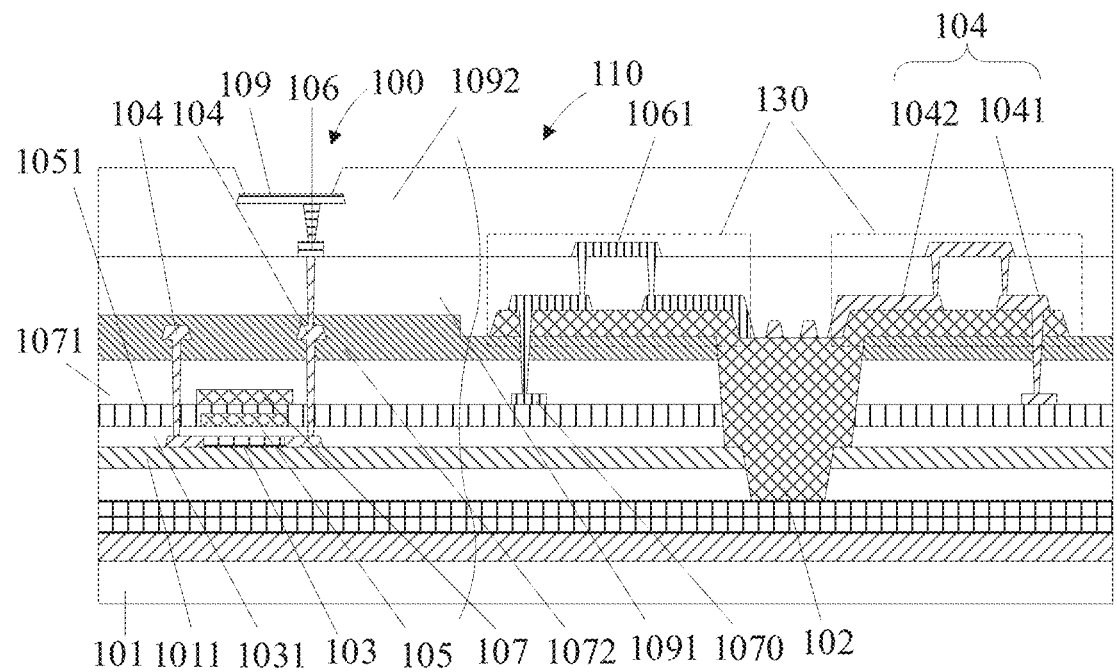
FIG. 1 is a cross-sectional view of a first metal layer of a thin film transistor (TFT) array substrate according to one embodiment of the present invention.
Figure 2:
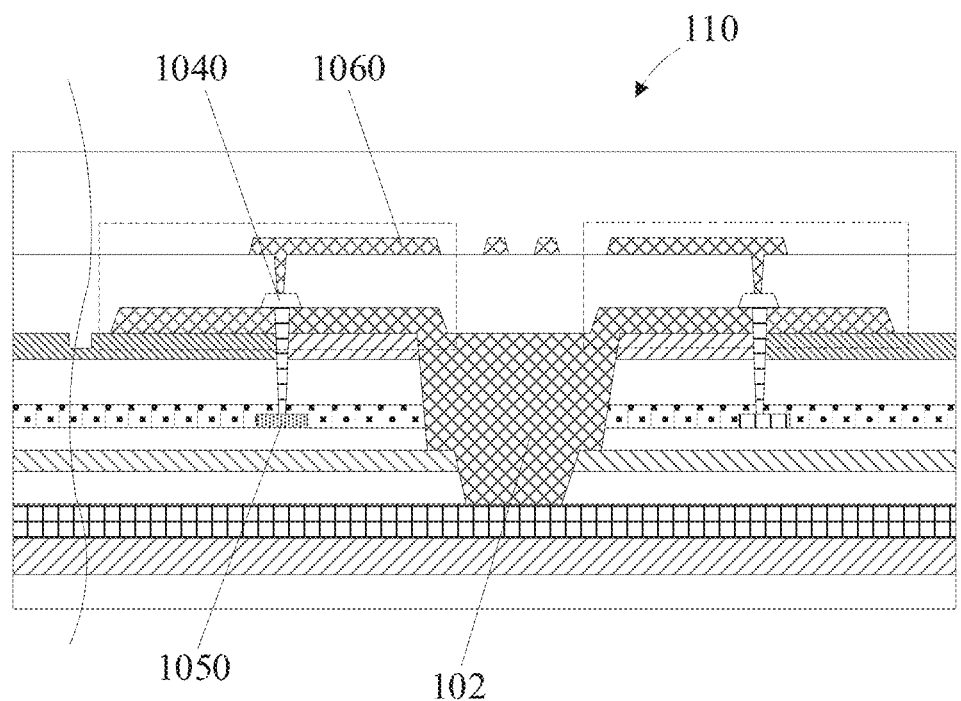
FIG. 2 is a cross-sectional view of a second metal layer of the TFT array substrate shown in FIG. 1, and only a portion of the bending region is illustrated.

Referring to FIG. 1 and FIG. 2, a TFT array substrate provided by one embodiment of the present invention includes a display region and a bending region.

The TFT array substrate includes a substrate layer 101, and the substrate layer 101 may specifically be a stacked structure using a dual polyimide (PI) substrate structure, that is, a dual PI layer combined with barrier layer, but is not limited thereto. A buffer layer 1011 is disposed on the substrate layer 101.

In the display region 100, a TFT device functional layer is disposed on the buffer layer 1011. Specifically, the TFT device functional layer includes an active layer 103, a first gate layer (GE1) 105, a second gate layer (GE2) 107, and a first metal layer (SD1) 104 used as source/drain layer. The insulating layer disposed between the different metal layers includes a first gate insulating layer (GI1) 1031, a second gate insulating layer (GI2) 1051, a first interlayer dielectric layer (ILD1) 1071, and a second interlayer dielectric layer (ILD2) 1072.

These metal layers and insulating layers may be a single layer or a stacked structure as needed. A passivation layer (PV) may be disposed on the first metal layer 104 to protect the first metal layer 104 from external moisture, which affects the service life of the TFT substrate.

Furthermore, a first planarization layer (PLN1) 1091 and a second planarization layer (PLN1) 1092 are further disposed on the second interlayer dielectric layer 1072, and a second metal layer (SD2) 106 serving as a Vdd trace and an anode metal layer (ANO) 109 are disposed in the two planarization layers. The second metal layer 106 and the anode metal layer 109 are connected through via holes, and the second metal layer 106 is also connected to the first metal layer 104 through via holes.

In the bending region, since it needs to realize a bending function, its structure is different from that of the display region. A filling layer (OILD) 102 made of an organic PI material, which is filled in a deep hole (DH), is disposed on the buffer layer 1011. The buffer layer 1011 is disposed on the substrate layer 101. Therefore, bending function is better achieved in the bending region. The filling layer 102 passes down through the buffer layer 1011 to the substrate layer 101, and the position of the bottom in the substrate layer 101 may be up to, for example, the upper PI layer surface in the dual PI layer structure.

Figure 3:
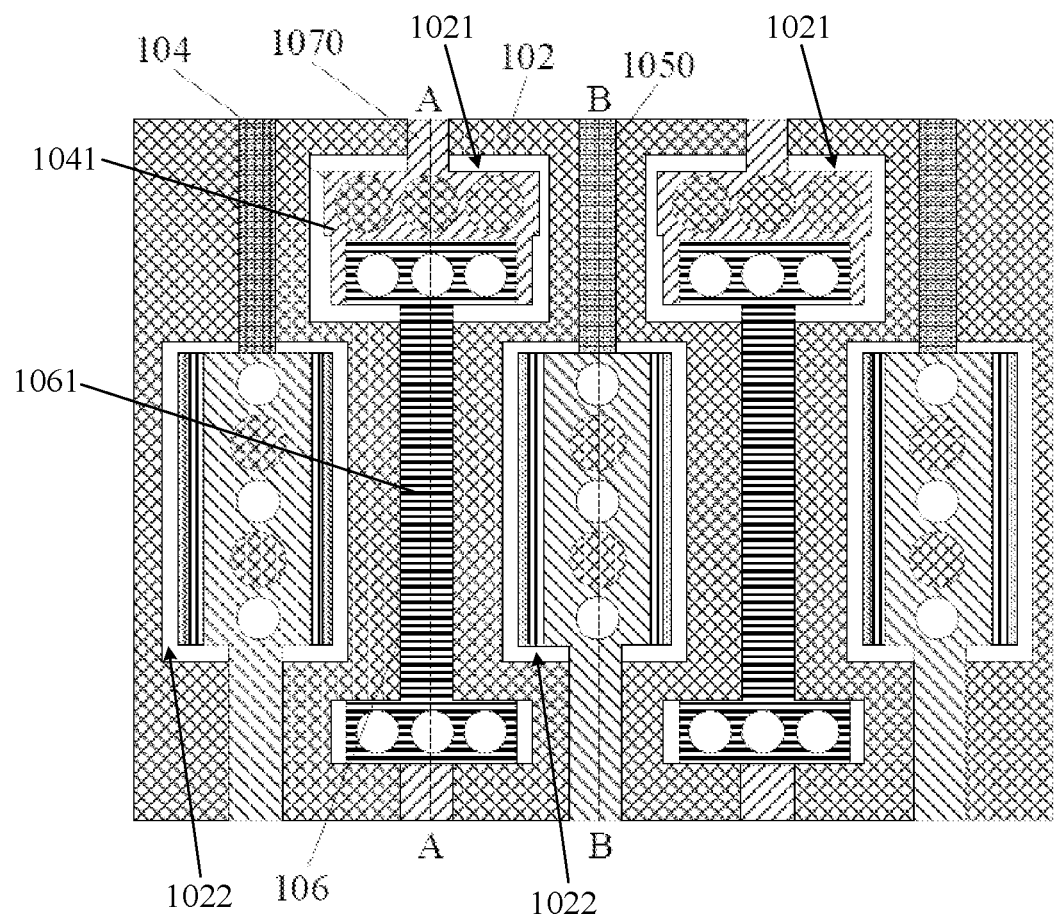
FIG. 3 is a plan view of a planar structure of the TFT array substrate shown in FIG. 1, and only the planar structure of the bending region is illustrated.

Next, after filling material of the filling layer 102 is filled in the deep hole (DH), the filling material of the filling layer 102 also protrudes outwardly from both sides of the deep hole edge to form two side end portions 1020, which are symmetrically disposed. Referring to FIG. 3, the filling layer 102 is provided with a plurality of first through-holes 1021 and a plurality of second through-holes 1022.

The first planarization layer 1091, which fills the first metal layer 104, is disposed above the side end portions 1020, and a second interlayer dielectric layer 1072 is disposed outside the side end portions 1020.

Figure 4:
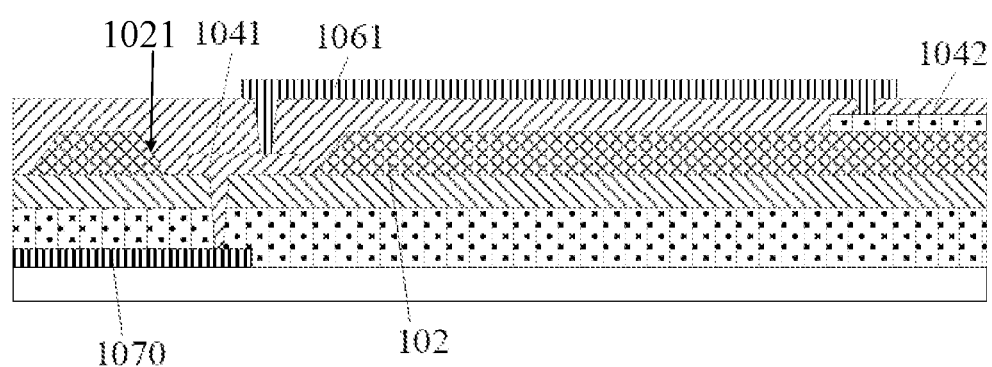
FIG. 4 is a cross-sectional view of A-A line of FIG. 3.

Referring to FIG. 3 and FIG. 4, a metal layer is also disposed in the bending region to use as a data line, a Vdd line, etc. The metal layer includes a first gate layer, a second gate layer, a first metal layer, and a second metal layer. Specifically, line connections between these metal layers are separately described below.

For example, the first metal layer 104 disposed in the bending region is generally used as data line. In the present invention, in order to overcome the problem of easy breakage, a segmented bridging structure is adopted. Specifically, referring to FIG. 3 and FIG. 4, the segmented bridging structure includes a first segment of the first metal layer 1041 and a second segment of the first metal layer 1042, the first segment of the first metal layer 1041 is disposed in each of the first through-holes 1021, and the second segment of the first metal layer 1042 is disposed on the organic filling layer 102 and located outside of the first through-holes 1021, the bridging metal layer 1061 is disposed between adjacent two of the second through-holes 1022, and the first segment of the first metal layer 1041 and the second segment of the first metal layer 1042 are connected to each other through a bridging metal layer 1061, so that the complete routing of the first metal layer is achieved by bridging, and the portion which is prone to breakage, and is no longer required to be provided with traces of the first metal layer, but is instead filled by the first planarization layer 1091. Therefore, the breakage problem in the prior art is prevented. Correspondingly, the first metal layer 1041 of the first segment bending region is electrically connected to the second gate layer 1070 of the bending region through a via hole, thereby implementing data line connection.

Figure 5:
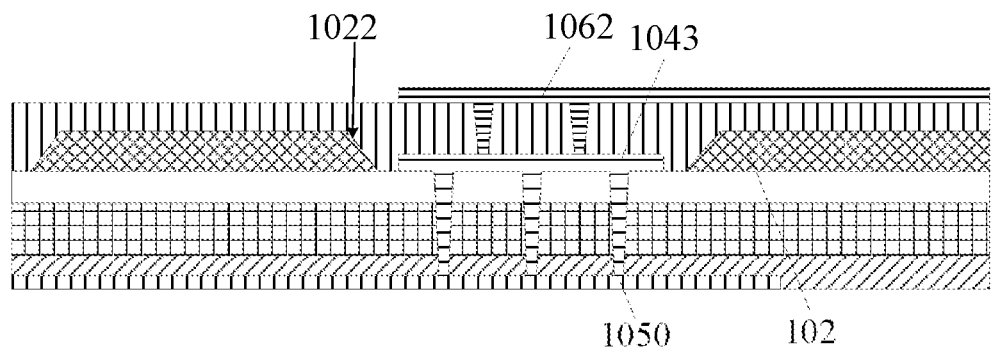
FIG. 5 is a cross-sectional view of B-B line of FIG. 3.
Figure 6:
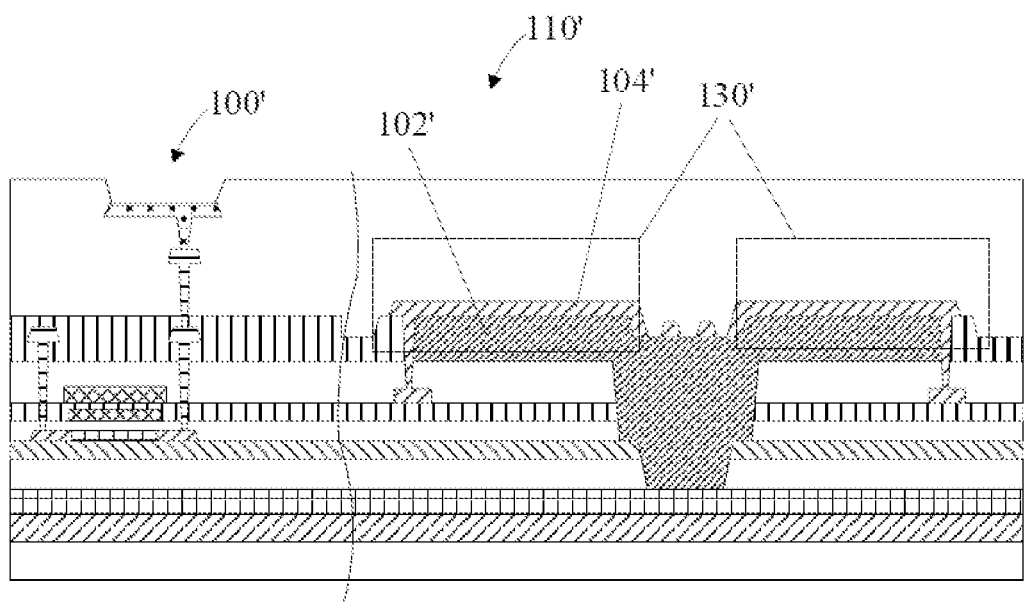
FIG. 6 is a cross-sectional view of a first metal layer of a TFT array substrate in the prior art.
Figure 7:
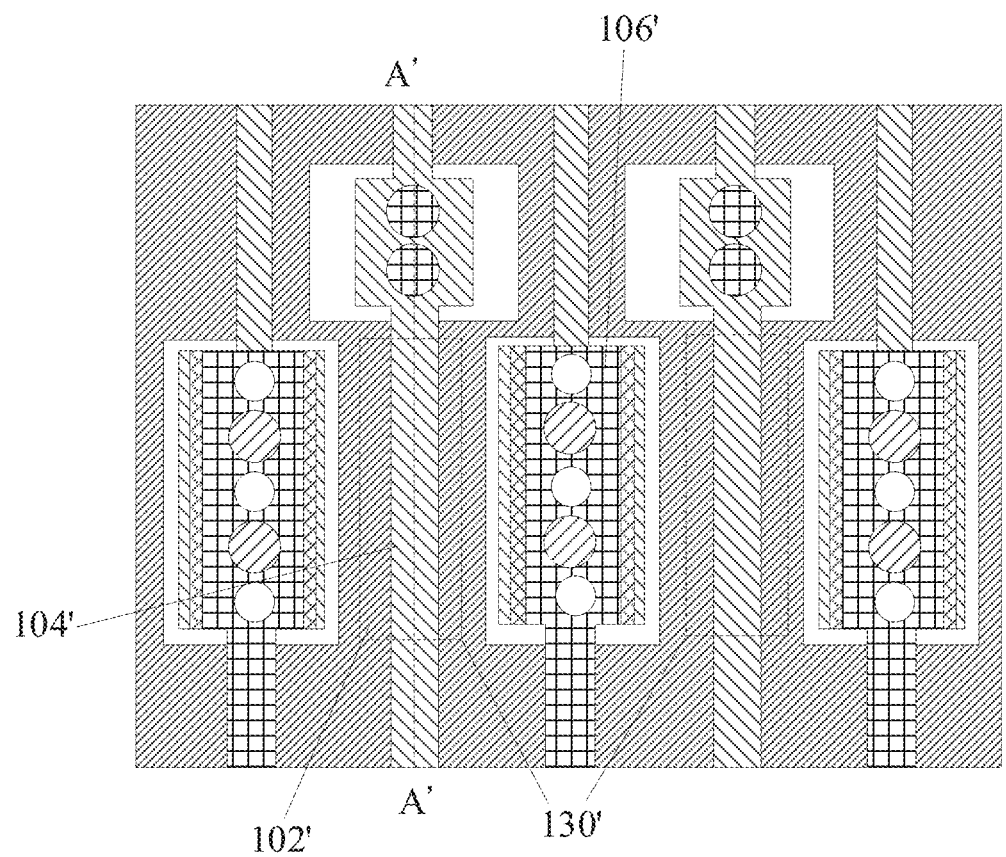
FIG. 7 is a plan view of a planar structure of the TFT array substrate shown in FIG. 6, and only the planar structure of the bending region is illustrated.
Figure 8:
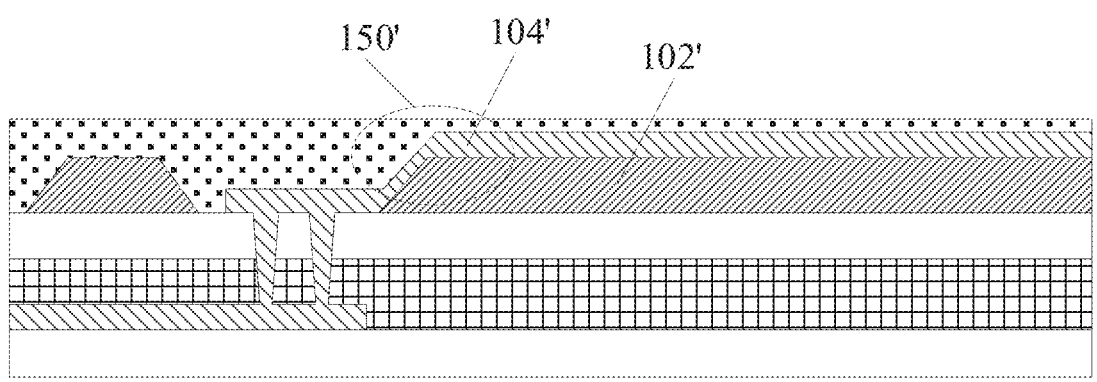
FIG. 8 is a cross-sectional view of A'-A' line of FIG. 6.

Referring to FIG. 4 and FIG. 5, the first segment of the first metal layer 1041 is electrically connected to the second gate layer 1070 through a via hole. The metal layer further includes a first transferring metal layer 1043 and a second transferring metal layer 1062. The first transferring metal layer 1043 is disposed in each of the second through-holes 1022, disposed at a same layer as the first segment of the first metal layer 1041, and electrically connected to the first gate layer 1050 through a via hole. The second transferring metal layer 1062 is disposed at a same layer as the bridging metal layer 1061, and electrically connected to the first gate layer 1050 through the first transferring metal layer 1043.

Furthermore, the bridging structure of the first metal layer (SD1) is not limited to being used only for the bending region, and may be disposed at any position on the TFT substrate as needed. For example, the bridging structure of the first metal layer may be disposed in the display region as needed. Meanwhile, it is not limited to the first metal layer (SD1) adopting a two-segment bridging structure, and other metal layers may also adopt the same. For example, the second metal layer (SD2) adopts a two-segment structure, and is bridged by the first metal layer (SD1) or the third metal layer, which is an anode metal layer (ANO). It may be determined as needed, and is not limited.

Referring to FIG. 3 and FIG. 5, the second metal layer 106 of the bending region generally used as Vdd lines is also disposed in the bending region, and the second metal layer 106 of the bending region is electrically connected to the first metal layer 104 and the first gate layer 1050 of the bending region through the bending region.

The present invention relates to a TFT array substrate, which adopts a novel segmented bridge routing structure of a first metal layer in a bending region thereof. A complete first metal layer is divided into two segments, and then a complete routing structure between the two segments disposed at intervals is achieved by adding a transferring second metal layer; thereby a trace of the original first metal layer in the bending region is replaced by the bridging second metal layer disposed above a position between two holes of an OILD filling layer, and the original position is filled in by a planarization layer, thereby preventing the problem of easy breakage at this position.

Furthermore, another embodiment of the present invention provides a display panel using the TFT array substrate related to the present invention. The display panel is preferably a flexible active matrix organic light emitting diode (AMOLED) display panel.

In summary, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A thin film transistor (TFT) array substrate, comprising a substrate layer and a metal layer disposed on the substrate layer, wherein the metal layer comprises a metal layer bridging structure, the metal layer bridging structure comprises a first metal layer and a bridging metal layer, and an insulating layer is disposed between the first metal layer and the bridging metal layer;

wherein the first metal layer comprises two segments of a first segment of the first metal layer and a second segment of the first metal layer, the first segment of the first metal layer and the second segment of the first metal layer are disposed at intervals, and the bridging metal layer connects the first segment of the first metal layer and the second segment of the first metal layer;

wherein the TFT array substrate comprises a display region and a bending region, and the metal layer bridging structure is disposed in the bending region; and wherein in the bending region, the TFT array substrate further comprises:

a gate layer disposed on the substrate layer;

an interlayer dielectric layer disposed on a side of the gate layer away from the substrate layer;

an organic filling layer disposed on the interlayer dielectric layer, wherein the organic filling layer is provided with a plurality of first through-holes and a plurality of second through-holes; wherein the first segment of the first metal layer is disposed in each of the first through-holes, and the second segment of the first metal layer is disposed on the organic filling layer and located outside of the first through-holes; the insulating layer is disposed on the first metal layer, and the bridging metal layer is disposed on a side of the insulating layer away from the first metal layer; and wherein the bridging metal layer is disposed between adjacent ones of the second through-holes.

2. The TFT array substrate according to claim 1, wherein the substrate layer in the display region is provided with a TFT device functional layer, and the metal layer comprises a first gate layer, a second gate layer, and a first metal layer of the TFT device functional layer.

3. The TFT array substrate according to claim 2, wherein the metal layer in the display region further comprises a second metal layer, and the second metal layer is electrically connected to the first metal layer through a via hole.

4. The TFT array substrate according to claim 3, wherein the metal layer in the display region further comprises an anode metal layer, and the anode metal layer is electrically connected to the second metal layer through the via hole.

5. The TFT array substrate according to claim 1, wherein the gate layer comprises a first gate layer and a second gate layer disposed on the first gate layer away from the substrate layer; and
wherein the first segment of the first metal layer is electrically connected to the second gate layer through a via hole.

6. The TFT array substrate according to claim 1, wherein the gate layer comprises a first gate layer and a second gate layer disposed on the first gate layer away from the substrate layer; and the TFT array substrate further comprises:

a first transferring metal layer disposed in each of the second through-holes, disposed at a same layer as the first segment of the first metal layer, and electrically connected to the first gate layer through a via hole; and a second transferring metal layer disposed at a same layer as the bridging metal layer, and electrically connected to the first gate layer through the first transferring metal layer.

7. The TFT array substrate according to claim 1, wherein the gate layer comprises a first gate layer and a second gate layer disposed on the first gate layer away from the substrate layer; and wherein the first segment of the first metal layer is electrically connected to the second gate layer through a via hole; and wherein the TFT array substrate further comprises:
- a first transferring metal layer disposed in each of the second through-holes, disposed at a same layer as the first segment of the first metal layer, and electrically connected to the first gate layer through a via hole; and
- a second transferring metal layer disposed at a same layer as the bridging metal layer, and electrically connected to the first gate layer through the first transferring metal layer.

8. A display panel comprising a TFT array substrate, wherein the TFT array substrate comprises a substrate layer and a metal layer disposed on the substrate layer, wherein the metal layer comprises a metal layer bridging structure, the metal layer bridging structure comprises a first metal layer and a bridging metal layer, and an insulating layer is disposed between the first metal layer and the bridging metal layer;
- wherein the first metal layer comprises two segments of a first segment of the first metal layer and a second segment of the first metal layer, the first segment of the first metal layer and the second segment of the first metal layer are disposed at intervals, and the bridging metal layer connects the first segment of the first metal layer and the second segment of the first metal layer;
- wherein the TFT array substrate comprises a display region and a bending region, and the metal layer bridging structure is disposed in the bending region; and wherein in the bending region, the TFT array substrate further comprises:
- a gate layer disposed on the substrate layer;
- an interlayer dielectric layer disposed on a side of the gate layer away from the substrate layer;
- an organic filling layer disposed on the interlayer dielectric layer, wherein the organic filling layer is provided with a plurality of first through-holes and a plurality of second through-holes; wherein the first segment of the first metal layer is disposed in each of the first through-holes, and the second segment of the first metal layer is disposed on the organic filling layer and located outside of the first through-holes; the insulating layer is disposed on the first metal layer, and the bridging metal layer is disposed on a side of the insulating layer away from the first metal layer; and
- wherein the bridging metal layer is disposed between adjacent ones of the second through-holes.

9. The display panel according to claim 8, wherein the display panel is a flexible active matrix organic light emitting diode (AMOLED) display panel.

10. The display panel according to claim 8, wherein the gate layer comprises a first gate layer and a second gate layer disposed on the first gate layer away from the substrate layer; and
- wherein the first segment of the first metal layer is electrically connected to the second gate layer through a via hole.

11. The display panel according to claim 8, wherein the gate layer comprises a first gate layer and a second gate layer disposed on the first gate layer away from the substrate layer; and the TFT array substrate further comprises:
- a first transferring metal layer disposed in each of the second through-holes, disposed at a same layer as the first segment of the first metal layer, and electrically connected to the first gate layer through a via hole; and
- a second transferring metal layer disposed at a same layer as the bridging metal layer, and electrically connected to the first gate layer through the first transferring metal layer.

12. The display panel according to claim 8, wherein the gate layer comprises a first gate layer and a second gate layer disposed on the first gate layer away from the substrate layer; and wherein the first segment of the first metal layer is electrically connected to the second gate layer through a via hole; and
- wherein the TFT array substrate further comprises:
- a first transferring metal layer disposed in each of the second through-holes, disposed at a same layer as the first segment of the first metal layer, and electrically connected to the first gate layer through a via hole; and
- a second transferring metal layer disposed at a same layer as the bridging metal layer, and electrically connected to the first gate layer through the first transferring metal layer.

\* \* \* \* \*